United States Patent [19]

Schoettl

[11] Patent Number: 6,059,382
[45] Date of Patent: May 9, 2000

[54] CONTROL DEVICE FOR AN ANTILOCKING SYSTEM AND PROCESS FOR PRODUCING A CONTROL DEVICE

[75] Inventor: Johannes Schoettl, Woerth, Germany

[73] Assignee: Siemens Aktiengesellschaft, Munich, Germany

[21] Appl. No.: 09/020,592

[22] Filed: Feb. 4, 1998

[30] Foreign Application Priority Data

Feb. 4, 1997 [DE] Germany ................ 197 04 152

[51] Int. Cl.[7] .................................................. B60T 8/36
[52] U.S. Cl. ........................... 303/119.3; 303/113.1
[58] Field of Search ............... 303/119.3, 119.2, 303/119.1, 113.1, DIG. 10; 251/129.01, 129.15; 137/884; 361/715, 719, 720, 760, 736, 749, 752, 796, 807, 622, 730, 716; 439/34; 29/739–741, 840, 832, 837, 845, 834, 890.13, 890.124; 228/180.21; 307/10.1

[56] References Cited

U.S. PATENT DOCUMENTS 5,520,447  5/1996  Burgdorf et al. ............ 303/119.3

FOREIGN PATENT DOCUMENTS

| 0 499 670 B1 | 8/1992 | European Pat. Off. . |
| 0 499 670 B1 | 10/1995 | European Pat. Off. . |
| 42 25 358 A1 | 2/1994 | Germany . |
| 43 21 331 A1 | 1/1995 | Germany . |
| 195 18 518 C1 | 8/1996 | Germany . |
| 195 18 522 A1 | 11/1996 | Germany . |

OTHER PUBLICATIONS

Publishing Internatinal Application WO92/12878 (Burgdorf et al.), dated Aug. 6, 1992.

*Primary Examiner*—Douglas C. Butler
*Attorney, Agent, or Firm*—Herbert L. Lerner; Laurence A. Greenberg

[57] ABSTRACT

A control device for placement on a valve block of an antilocking system and a process for producing the control device, include a conductor track carrier to be thermally coupled to a wall of the valve block. An electronic circuit for controlling valves is disposed on the conductor track carrier which is constructed in one piece. The conductor track carrier has a first region which is equipped with valve coils for actuating the valves of the valve block, and a second region which is equipped with active electronic components and is free of valve coils.

13 Claims, 5 Drawing Sheets

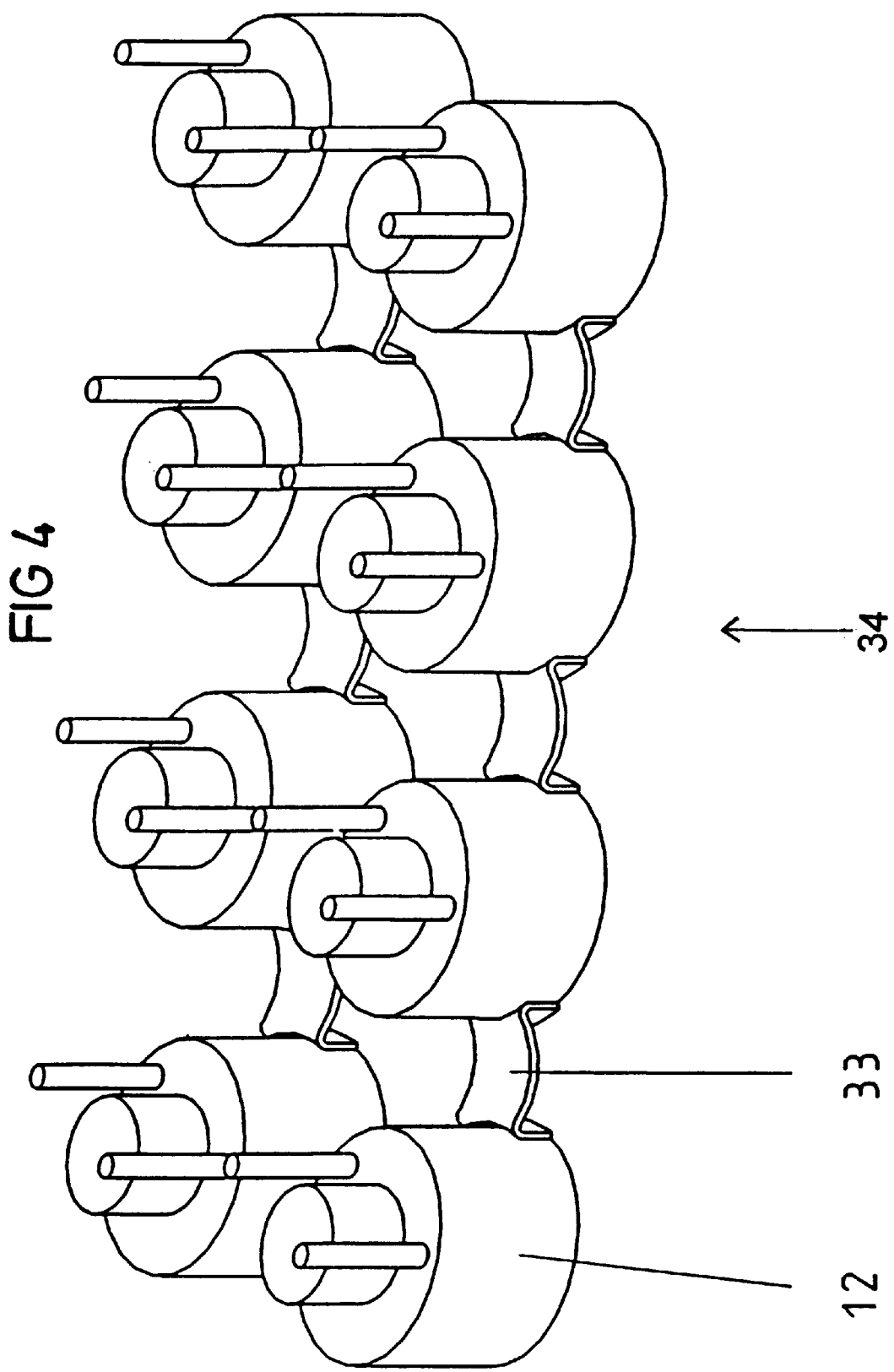

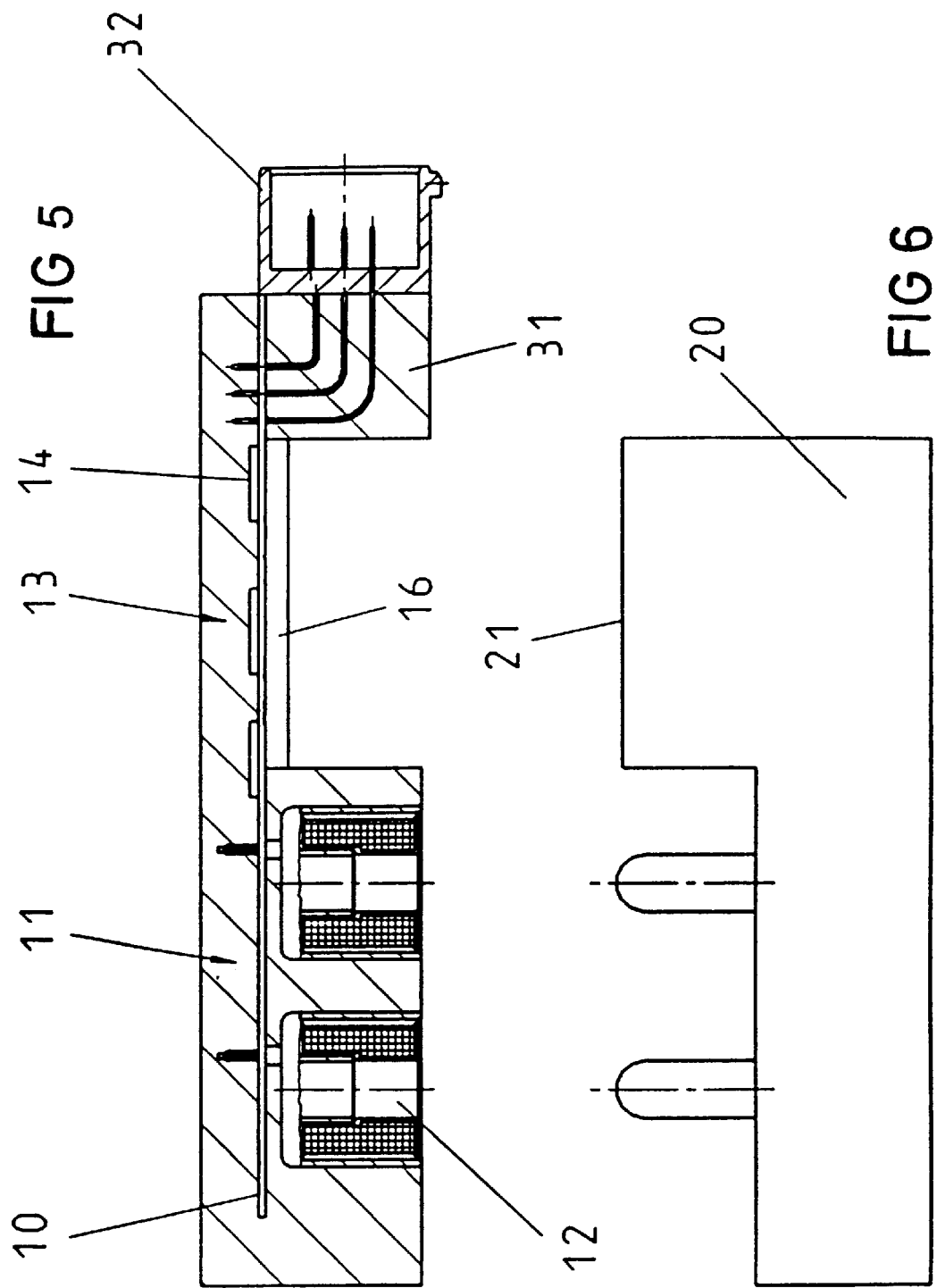

CONTROL DEVICE FOR AN ANTILOCKING SYSTEM AND PROCESS FOR PRODUCING A CONTROL DEVICE

BACKGROUND OF THE INVENTION

Field of the Invention

The invention relates to a control device to be placed on a valve block of an antilocking system, including a conductor track carrier on which an electronic circuit for controlling the valves is disposed and which is thermally coupled to a wall of the valve block. The invention also relates to a process for manufacturing the control device.

German Patent DE 195 18 518 C1 discloses a control device for an antilocking system of a motor vehicle, in which heat generated by power components is intended to be dissipated outward. To that end, a first printed circuit board is fastened flat against a side wall of a valve block, through the use of which the heat generated by the power components is dissipated outward. A second printed circuit board is disposed perpendicular to the first printed circuit board and is electrically connected to it through the use of bonding wires. Coils which are disposed on the second printed circuit board electromagnetically actuate the valves of the valve block.

In the production of the control device, the valve block of the antilocking system must be supplied by the manufacturer of the brake system to the manufacturer of the electronic control device since the printed circuit board with the power components must be fastened directly to the valve block. Furthermore, separate respective process steps are necessary in order to equip each of the two printed circuit boards and to produce an electrical connection between the printed circuit boards.

European Patent 0 499 670 B1 has disclosed a valve control device which has a housing that contains two printed circuit boards connected to each other through cables, wherein one printed circuit board has an electronic circuit and the other printed circuit board contains valve coils. The control device is supplied by the electronics manufacturer to the maker of an ABS braking system, who merely has to place the control device on a valve block and attach it there.

In order to produce that control device, two printed circuit boards must be handled in separate process steps, inserted into a relatively costly housing, and connected to the valve coils, a plug, and each other. A subsequent soldering in the housing is required, which takes up free spaces that cannot be used for other things. In order to provide the sealing of the housing and the covering of the printed circuit board in relation to the engine compartment, an additional plastic cover is required, which must be sealed with a liquid seal and hardened. As a rule, a pressure compensation element must be installed for the purpose of pressure compensation in the volume between the printed circuit board and the housing cover.

SUMMARY OF THE INVENTION

It is accordingly an object of the invention to provide a control device for placement on a valve block of an antilocking system and a process for producing a control device, which overcome the hereinafter-mentioned disadvantages of the heretofore-known devices and processes of this general type and in which the control device can be produced in a particularly efficient manner.

With the foregoing and other objects in view there is provided, in accordance with the invention, a control device for placement on a valve block of an antilocking system, the control device comprising a conductor track carrier for thermal coupling to a wall of a valve block and for receiving an electronic circuit thereon for controlling valves, the conductor track carrier constructed in one-piece and having a first region and a second region; the first region having valve coils for actuating the valves of the valve block; and the second region having active electronic components and being free of valve coils.

In accordance with another feature of the invention, the conductor track carrier has a zone between the first and second regions, the conductor track carrier is flexible at least in the zone, and the first region and the second region are disposed at an angle of between 30° and 120° relative to each other.

In accordance with a further feature of the invention, there is provided a heat conducting plate connected in the second region of the conductor track carrier being free of valve coils, the heat conducting plate contacting the wall of the valve block after installation of the control device on the valve block.

In accordance with an added feature of the invention, the second region of the conductor track carrier has a section extending beyond the wall of the valve block, and the active components are disposed on the section.

In accordance with an additional feature of the invention, there is provided an outer housing part remote from the valve block, the housing part formed of plastic extrusion coated or foam coated onto the conductor track carrier.

In accordance with yet another feature of the invention, the conductor track carrier has an edge region adjoining the second region being free of valve coils, the edge region is disposed substantially perpendicular to the second region of the conductor track carrier, and a plug or a socket is affixed in the edge region.

With the objects of the invention in view there is also provided a process for producing a control device for placement on a valve block of an antilocking system, which comprises equipping a conductor track carrier with electronic components including valve coils disposed in one region of the to conductor track carrier and other electronic components; soldering the valve coils and the other electronic components to the conductor track carrier; and providing the valve coils and the conductor track carrier with a housing part after the soldering.

In accordance with another mode of the invention, there is provided a process which comprises combining the valve coils designated for a conductor track carrier into a block and supplying the valve coils as a group to the conductor track carrier.

In accordance with a further mode of the invention, there is provided a process which comprises providing the conductor track carrier with a plastic housing part by foam coating or extrusion coating.

In accordance with a concomitant mode of the invention, there is provided a process which comprises bending the fully equipped conductor track carrier along at least one flexible zone, and inserting the bent conductor track carrier into a casting form or a housing part.

The one-piece construction of the conductor track carrier permits it to be fully equipped and soldered before it is provided with a housing. No further soldering step is required for installation in a housing or for producing an electrical contact with the valve coils. Immediately after the soldering of the components to the conductor track carrier and before the provision of a housing part, a function test can be carried out, which includes the valve coils.

Other features which are considered as characteristic for the invention are set forth in the appended claims.

Although the invention is illustrated and described herein as embodied in a control device for an antilocking system and a process for producing a control device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is an enlarged perspective view which shows a coil block;

FIG. 5 is a longitudinal-sectional view showing a conductor track carrier which is to be placed on an L-shaped valve block; and FIG. 6 is a view of an L-shaped valve block.

DESCRIPTION OF THE PREFERRED EMBODIMENTS

Figure 1:
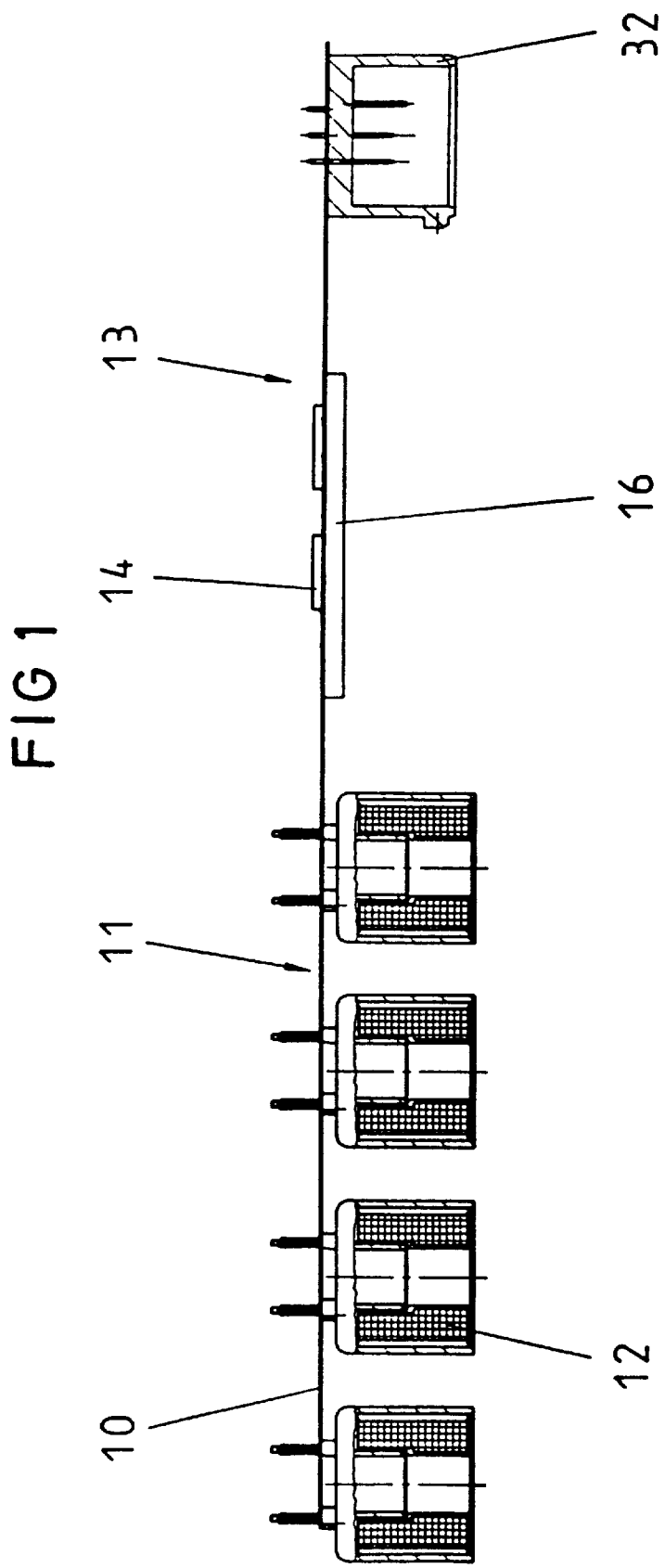
FIG. 1 is a fragmentary, diagrammatic, longitudinal-sectional view of a fully equipped conductor track carrier before it is provided with a housing.

Referring now to the figures of the drawings in detail and first, particularly, to FIG. 1 thereof, there is seen a fully equipped conductor track carrier 10 after being equipped with all electronic components, including active electronic components 14 and passive electronic components such as valve coils 12 and a multipoint connector 32. The conductor track carrier 10 is a continuously flexible printed circuit board which is provided with a heat conducting plate 16 made of aluminum on its unequipped underside in the region of the active electronic components 14 or power components. A green (unfired) flexible ceramic foil (Low Temperature Cofired Ceramics, LTCC) is suitable as the printed circuit board. The assembly of the components is simplified through the use of the previous attachment of a heat conducting plate to the flexible printed circuit board.

Figure 2:
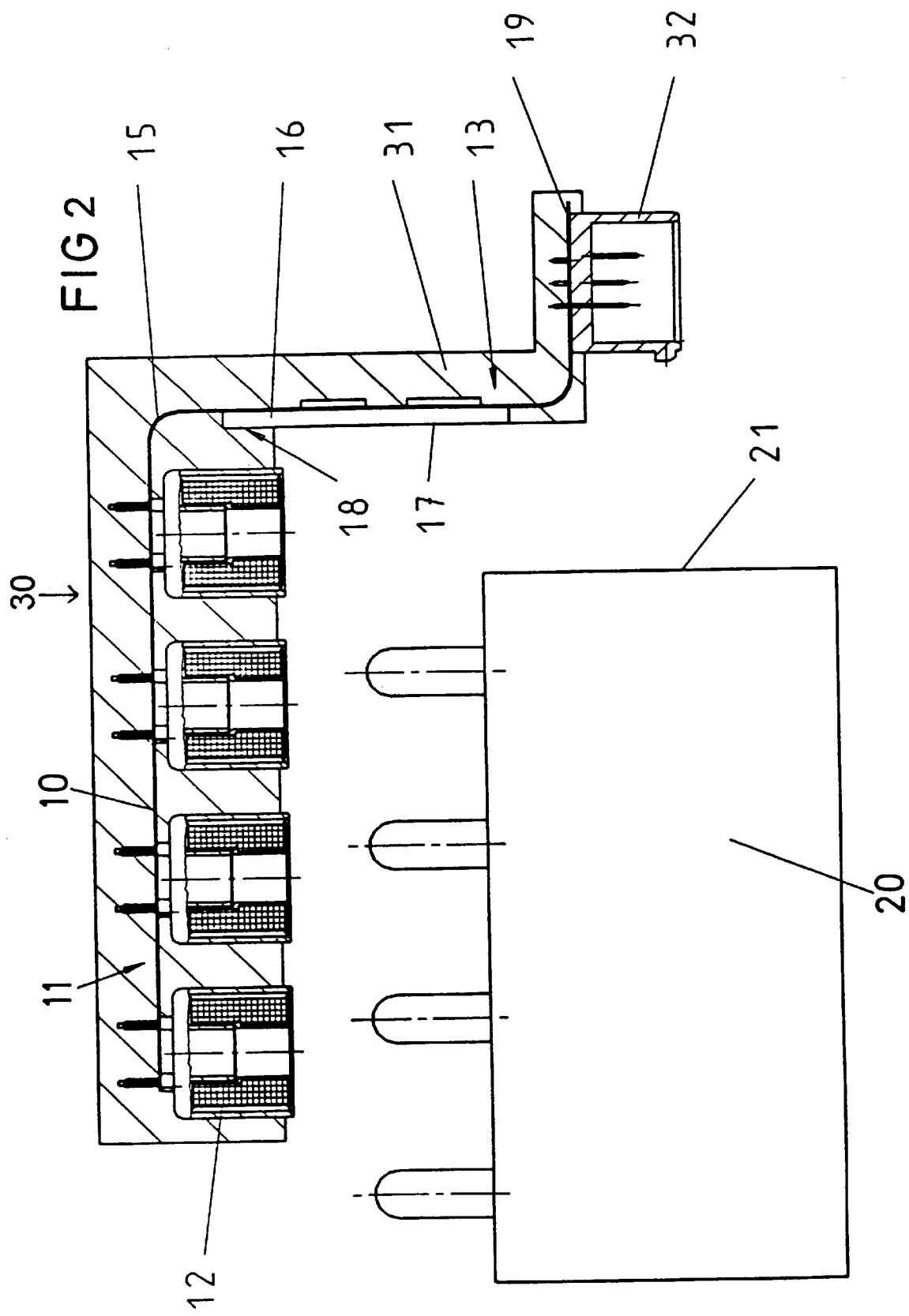
FIG. 2 is a longitudinal-sectional view of a valve block and the conductor track carrier of FIG. 1 after it has been provided with a housing.

FIG. 2 shows a control device 30 before being attached to a valve block 20. The printed circuit board 10 is bent in a section or zone 15 that is constructed as a flexible zone so that a first region 11, which has the valve coils 12, is disposed at an angle of at least 30° and at most 120° relative to a second region 13, that is equipped with the active components 14 and has no valve coils. As is shown, the regions 11 and 13 are preferably perpendicular to each other.

In order to form a housing 31 of the control device 30, the bent printed circuit board is inserted into a form and extrusion coated or foam coated with plastic, for example with polyurethane (PU). As a result, the control device is hermetically sealed in relation to the outside without further sealing measures on the end remote from the valve block. In addition, after the mounting of the control device on the valve block, the housing, possibly together with the printed circuit board, seals the control device in relation to the outside.

Heat dissipation from the active electronic components 14 is carried out by a flat contact of the printed circuit board 10 with a wall 21 of the valve block 20. The flat contact with the wall 21 of the valve block is produced through the heat conducting plate 16. This heat conducting aluminum plate can be constructed to be very thin since the heat dissipation takes place directly on the metallic valve block.

The heat conducting plate 16 extends beyond a section 17, which comes in contact with the wall 21 of the valve block, into a section 18, which adjoins the first region 11 of the printed circuit board. Therefore this section 18, which is not directly in contact with the wall 21 of the valve block, can also contain power components. The structure of the control device 30 can therefore be kept particularly compact.

An edge region 19 of the second region 13 of the printed circuit board 10 is bent in a direction away from the valve block 20 parallel to the first region 11 of the printed circuit board which contains the valve coils 12, in order to accommodate the multipoint connector 32. This multipoint connector is a single multipoint plug. A heretofore standard multipoint plug that is integrated into the housing in a costly manner, in which the plug is soldered on only after the printed circuit board is inserted into the housing, is no longer necessary.

Figure 3:
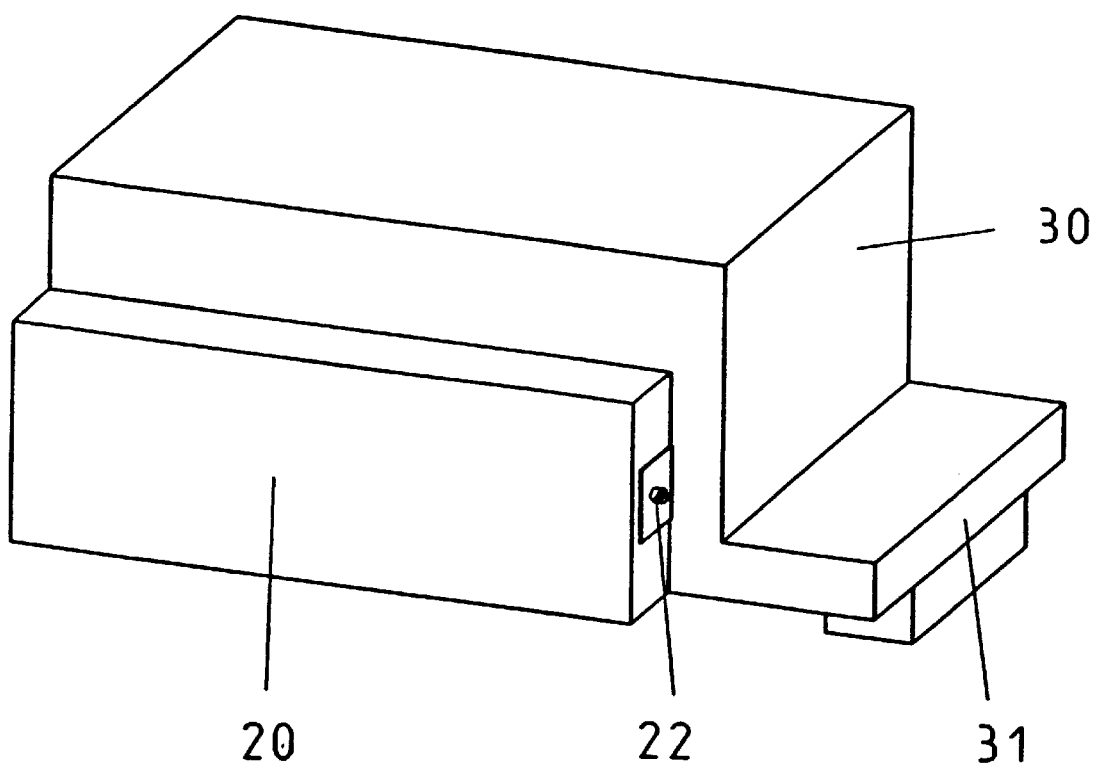
FIG. 3 is a perspective view of a control device mounted on the valve block of FIG. 2.

FIG. 3 shows the control device 30 fastened to the valve block 20 through the use of screws 22. In this instance, the heat conducting plate 16 is directly connected to the valve block 20 in order to assure a favorable heat dissipation.

As is shown in FIG. 4, the valve coils 12 can be combined into a block 34 before the assembly of the printed circuit board 10. To this end, plastic is sprayed onto the coils 12. This plastic forms a flexible connection 33 between the valve coils 12 so that the coils have a certain mobility in the X, Y, and Z directions in order to compensate for manufacturing tolerances of the valve block in the installation of the control device 30 on the valve block 20. The flexible connection is depicted as an arched plastic band.

The coil block 34 and the multipoint connector 32 are plugged into the printed circuit board 10 that is held by a workpiece carrier. In order to provide interfacially contacted soldering points, previously occurring solder paste pressure also produces enough of a solder deposit for soldering to be reliably performed.

The completely equipped printed circuit board 10 is soldered in a reflow oven. To this end, it is necessary that the coils 12 and the multipoint connector 32 be formed of a plastic which is suitable for the temperatures produced in the soldering oven, for example polycarbonate therephthatlate (PCT). After the soldering, the subassembly can be completely tested.

FIG. 5 is a sectional view of the housing 31 that is foam coated onto a completely equipped and soldered printed circuit board 10, before it is fastened to the valve block 20 that is depicted in FIG. 6 as being constructed in an L-shape.

The printed circuit board 10 constitutes an essentially smooth surface which, in the region 13 equipped with the active electronic components 14, is thermally coupled to the surface of the wall 21 of a projection of the valve block. Even though the printed circuit board can also be brought into direct contact with the surface of the valve block, the heat conducting plate 16 is provided between the surface of the wall 21 of the valve block and the conductor track carrier 10. As a result, it is possible in principle to keep the contact surface of the wall 21 relatively thin. The plug 32 is aligned parallel to the printed circuit board.

I claim:

1. A control device for placement on a valve block of an antilocking system, the control device comprising:

a flexible printed circuit board conductor track carrier for thermal coupling to a wall of a valve block and for receiving an electronic circuit thereon for controlling valves, said conductor track carrier constructed in one-piece and having a first region, a second region and an edge region adjoining said second region, the valve block having a wall and said conductor track carrier contacting the wall of the valve block;

said first region having valve coils for actuating the valves of the valve block;

said second region having active electronic components and being free of valve coils, said conductor track carrier having an unequipped underside and a heat conducting plate in said second region on said unequipped underside;

a connector affixed in said edge region; and an outer housing part remote from the valve block on said conductor track carrier.

2. The control device according to claim 1, wherein said conductor track carrier has a zone between said first and second regions, said conductor track carrier is flexible in said zone, and said first region and said second region are disposed at an angle of between 30° and 120° relative to each other.

3. The control device according to claim 1, wherein said heat conducting plate contacts the wall of the valve block after installation of the control device on the valve block.

4. The control device according to claim 1, wherein said second region of said conductor track carrier has a section extending beyond the wall of the valve block, and said active components are disposed on said section.

5. The control device according to claim 1, wherein said outer housing part is a plastic extrusion coating on said conductor track carrier.

6. The control device according to claim 1, wherein said edge region is disposed substantially perpendicular to said second region.

7. The control device according to claim 1, wherein said outer housing part is a foam coating on said conductor track carrier.

8. A process for producing a control device for placement on a valve block of an antilocking system, which comprises:

equipping a flexible printed circuit board conductor track carrier with electronic components including valve coils disposed in one region of the conductor track carrier and other electronic components;

soldering the valve coils and the other electronic components to the conductor track carrier;

providing a heat conducting plate on the conductor track carrier;

providing a connector to the conductor track carrier; and providing the valve coils and the conductor track carrier with a housing part remote from the valve block after the soldering such that the conductor track carrier contacts a wall of the valve block.

9. The process according to claim 8, which comprises combining the valve coils designated for a conductor track carrier into a block and supplying the valve coils as a group to the conductor track carrier.

10. The process according to claim 8, which comprises providing the conductor track carrier with a plastic housing part by foam coating.

11. The process according to claim 8, which comprises providing the conductor track carrier with a plastic housing part by extrusion coating.

12. The process according to claim 8, which comprises bending the fully equipped conductor track carrier along at least one flexible zone, and inserting the bent conductor track carrier into a casting form.

13. The process according to claim 8, which comprises bending the fully equipped conductor track carrier along at least one flexible zone, and inserting the bent conductor track carrier into a housing part.

* * * * *